United States Patent [19]
Wieczorek et al.

[11] Patent Number: 6,037,232
[45] Date of Patent: Mar. 14, 2000

[54] SEMICONDUCTOR DEVICE HAVING ELEVATED SILICIDATION LAYER AND PROCESS FOR FABRICATION THEREOF

[75] Inventors: Karsen Wieczorek; Frederick N. Hause, both of Austin, Tex.

[73] Assignee: Advanced Micro Devices, Austin, Tex.

[21] Appl. No.: 08/929,697

[22] Filed: Sep. 15, 1997

[51] Int. Cl.$^7$ .................................................. H01L 29/76
[52] U.S. Cl. ......................... 438/302; 438/582; 438/682; 257/382; 257/900
[58] Field of Search ..................................... 257/384, 382, 257/383, 900, 388, 377; 438/302, 305, 233, 581, 582, 583, 655, 682, 683

[56] References Cited

U.S. PATENT DOCUMENTS

| | | | |
|---|---|---|---|
| 5,397,909 | 3/1995 | Moslehi ................................... | 257/383 |
| 5,635,746 | 6/1997 | Kimura et al. ........................... | 257/382 |
| 5,739,573 | 4/1998 | Kawaguchi .............................. | 257/384 |
| 5,841,173 | 11/1998 | Yamashita ............................... | 257/384 |

OTHER PUBLICATIONS

S. Wolf, "Contact Technology and Local Interconnects for VLSI", *Silicon Processing for the VLSI Era—Volume II*, pp. 143–153, 157–158 (1990).

Primary Examiner—Donald L. Monin, Jr.
Attorney, Agent, or Firm—Williams, Morgan & Amerson, P.C.

[57] ABSTRACT

A semiconductor device having an elevated silicidation layer and process for fabricating such a device is provided. Consistent with one embodiment of the invention, at least one gate electrode is formed over a substrate and silicon is formed over at least one active region of the substrate adjacent the gate electrode. A layer of metal is then formed over the silicon. Using the metal layer and the silicon, a silicidation layer is formed over the active region. The active region may, for example, include a source/drain region. The ratio of the depth of the silicidation layer to the depth of the source/drain region may, for example, be greater than or equal to 0.75:1. In other embodiments, the ratio of the silicidation layer depth to source/drain region depth may be greater than or equal to 1:1, 1.5:1 or 2:1.

24 Claims, 2 Drawing Sheets

SEMICONDUCTOR DEVICE HAVING ELEVATED SILICIDATION LAYER AND PROCESS FOR FABRICATION THEREOF

FIELD OF THE INVENTION

The present invention is directed generally to semiconductor devices and, more particularly, to a semiconductor device having an elevated silicidation layer and process for fabricating such a device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applications in numerous disciplines. One such silicon-based semiconductor device is a metal-oxide-semiconductor (MOS) transistor.

The principal elements of a typical MOS semiconductor device are illustrated in FIG. 1. The device generally includes a semiconductor substrate 101 on which a gate electrode 103 is disposed. The gate electrode 103 acts as a conductor. An input signal is typically applied to the gate electrode 103 via a gate terminal (not shown). Heavily-doped source/drain regions 105 are formed in the semiconductor substrate 101 and are connected to source/drain terminals (not shown). The source/drain regions 105 may, for example, be lightly-doped drain (LDD) source/drain regions as shown. As illustrated in FIG. 1, the typical MOS transistor is symmetrical, which means that the source and drain are interchangeable. Whether a region acts as a source or drain depends on the respective applied voltages and the type of device being made (e.g., PMOS, NMOS, etc.). Thus, as used herein, the term source/drain region refers generally to an active region used for the formation of a source or drain.

A channel region 107 is formed in the semiconductor substrate 101 beneath the gate electrode 103 and separates the source/drain regions 105. The channel is typically lightly doped with a dopant of a type opposite to that of the source/drain regions 105. The gate electrode 103 is generally separated from the semiconductor substrate 101 by an insulating layer 109, typically an oxide layer such as $SiO_2$. The insulating layer 109 is provided to prevent current from flowing between the gate electrode 103 and the source/drain regions 105 or channel region 107.

In a completed device structure, the source/drain regions 105 and gate electrode 103 are typically contacted by metal lines in order to interconnect these structures with other elements of the device. To facilitate contact between a metal line and the source/drain regions 105 or the gate electrode 103, a silicidation layer 111 is typically formed over the source/drain regions 105 and the gate electrode 103 prior to forming the metal line. The silicidation layer 111 is typically formed by depositing a layer of metal, such as tungsten or cobalt, over the substrate 101 and annealing the wafer. During the annealing process, the deposited metal reacts with underlying silicon and forms a metal silicidation layer. The thickness of the silicidation layer 111 is limited by the depth of the source/drain junction as the silicidation layer 111 must be spaced from the source/drain junction to maintain source/drain integrity. Typical thicknesses of the silicidation layer are less than ¾ of the depth of the source/drain junction. A more detailed description of silicidation layers and the fabrication thereof may be found in S. Wolf, *Silicon Processing for the VLSI Era*, Vol. 2: Processing Integration, pp. 143–153 and 157–158.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region and the drain region. In this manner, an electric field controls the current flow through the channel region 107. This type of device is commonly referred to as a MOS field-effect-transistor (MOSFET).

Semiconductor devices, like the one described above, are used in large numbers to construct most modern electronic devices. As a larger number of such devices are integrated into a single silicon wafer, improved performance and capabilities of electronic devices can be achieved. In order to increase the number of semiconductor devices which may be formed on a given surface area of a substrate, the semiconductor devices must be scaled down (i.e., made smaller). This is accomplished by reducing the lateral and vertical dimensions of the device structure.

The depth of the source/drain region is an important dimension which is scaled down as the device structure is made smaller. Using the conventional process described above, as the source/drain junction depth is reduced, the thickness of the silicidation layer must be reduced in order to maintain spacing between the source/drain junction and the silicidation layer and avoiding shorting the source/drain region. Reducing the thickness of the silicidation layer however increases the sheet resistance of the layer and negatively impacts the performance of the device. Consequently, using conventional processes there is a trade-off between the depth of the source/drain region and the depth of the silicidation layer. This trade-off limits further scaling of semiconductor devices.

SUMMARY OF THE INVENTION

Generally, the present invention relates to a semiconductor device having an elevated silicidation layer and process for fabricating such a device.

Consistent with one embodiment of the invention, at least one gate electrode is formed over a substrate and silicon is formed over at least one active region of the substrate adjacent the gate electrode. A layer of metal is then formed over the silicon. Using the metal layer and the silicon, a silicidation layer is formed over the active region. The active region may, for example, include a source/drain region. The ratio of the depth of the silicidation layer to the depth of the source/drain region may, for example, be greater than or equal to 0.75:1.

In another embodiment of the invention, a semiconductor device is provided having a substrate and at least one gate electrode disposed over the substrate. At least one source/drain region is disposed in the substrate adjacent the gate electrode and a silicidation layer is disposed over the source/drain region. The ratio of the silicidation layer depth to source/drain region depth is greater than or equal to 0.75:1. In other embodiments, the ratio of the silicidation layer depth to source/drain region depth may be greater than or equal to 1:1, 1.5:1 or 2:1.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which.

Figure 1:
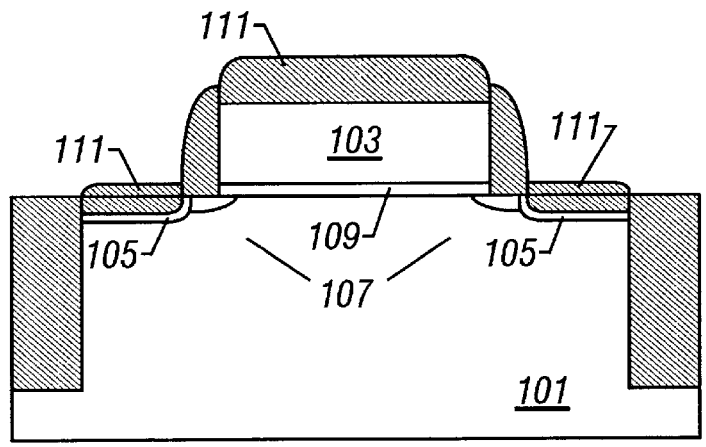
FIG. 1 illustrates one typical MOS semiconductor device structure.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE VARIOUS EMBODIMENTS

The present invention is believed to be applicable to a number of semiconductor devices having silicidation layers. The invention is believed to be particularly beneficial in MOS structures. While the present invention is not so limited, an appreciation of various aspects of the invention will be gained through a discussion of the fabrication process and characteristics of such a device in connection with the examples provided below.

FIGS. 2A–2E illustrate an exemplary process for fabricating a MOS semiconductor device having an elevated silicidation layer. Using known techniques, transistor devices (only one of which is shown) are formed on a silicon substrate 201. The transistor device 203 is generally formed between isolation regions 205 and typically includes a gate electrode 207 which is usually insulated from the substrate 201 by a thin oxide layer 209. On the sidewalls of the gate electrode 207, there are typically formed spacers 211.

Figure 2A:
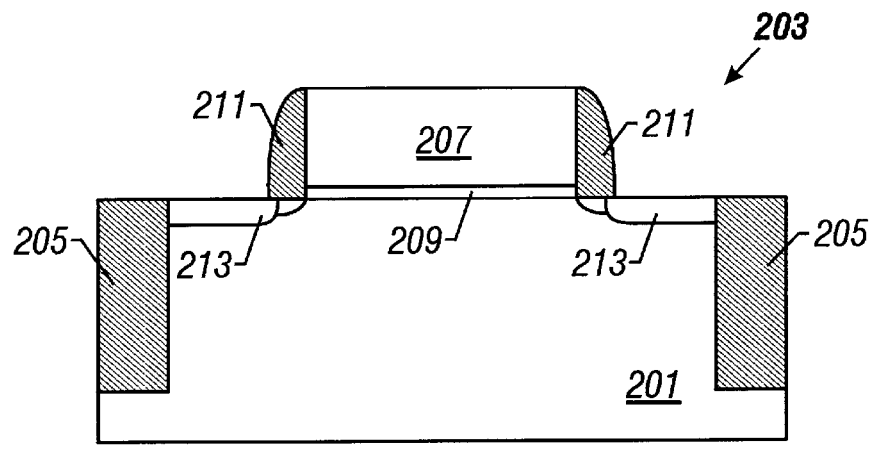
FIGS. 2A–2E illustrate a fabrication process in accordance with one embodiment of the invention.

In active regions of the substrate 201 adjacent the gate electrode 207, there are typically formed source/drain regions 213. While LDD source/drain regions are illustrated, the invention is not so limited. Generally, any type of source/drain region can employed with the present invention. The depth of the source/drain regions can vary with the type of transistor device 203. Exemplary depths range from about 300 to 1000 angstroms (Å). The resultant structure is illustrated in FIG. 2A. It will be appreciated that a number of different known fabrication techniques could be used to obtain the structure depicted in FIG. 2A.

Figure 2B:
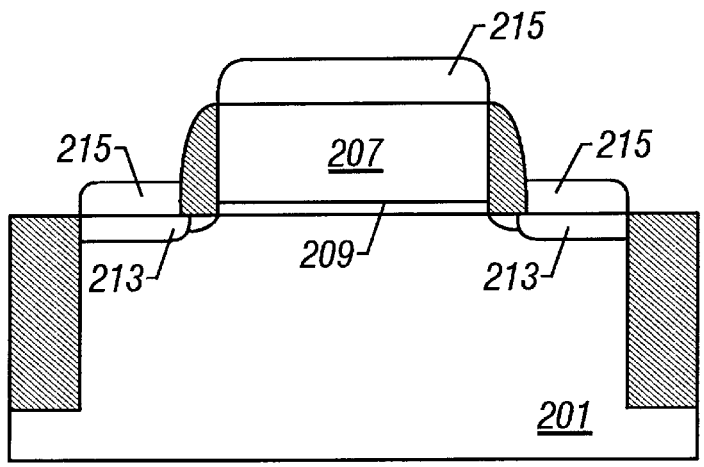

Silicon 215 is formed over exposed portions of the source/drain regions 213, as illustrated in FIG. 2B. The silicon 215 may, for example, be formed by selective epitaxy deposition of silicon using known techniques. Generally, selective epitaxy of silicon selectively forms silicon over exposed silicon areas, such as exposed portions of the silicon substrate, e.g., exposed portions of the source/drain region 213. When a polysilicon gate electrode 207 is used, silicon 215 may also be formed over the gate electrode 207. The silicon 215 will be used to form a silicidation layer, as will be discussed below. The depth of the silicon 215 is suitably selected in consideration of the desired depth of the silicidation layer. Exemplary silicon 215 depths range from about 250 to 500 Å for many applications.

Figure 2C:
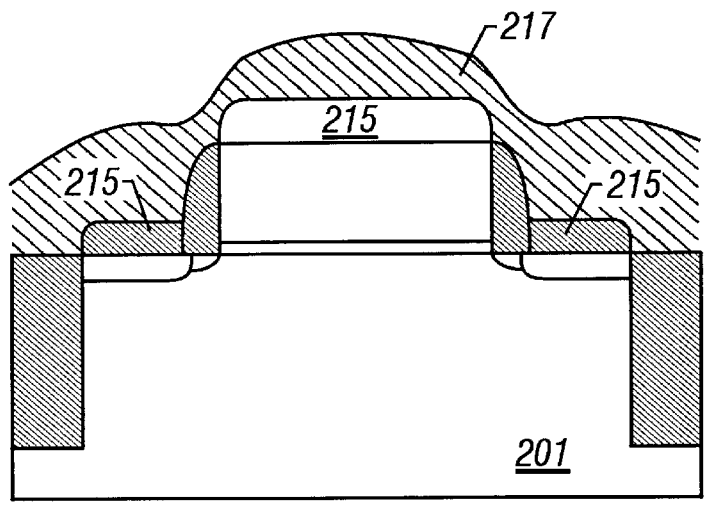

A metal layer 217 is formed over the substrate 201, as illustrated in FIG. 2C. The metal layer 217 is typically formed using, for example, well-known deposition techniques. The type of metal used in the metal layer 217 can be any of the number of different types of metal, including, for example, titanium (Ti), cobalt (Co), or nickel (Ni).

The metal layer 217 will be used to form a silicidation layer. The depth of the metal layer 217 is selected in consideration of the desired depth of the silicidation layer and in consideration of the type of metal used. The type of metal is taken into consideration since different metals can consume silicon at different rates. For example, in the formation of $TiS_2$, for every 1 Å of Ti which is consumed, about 2.5 Å of Si is consumed. In the formation of $CoSi_2$, about 1 Å of Co is consumed for every 3.5 Å of Si. Exemplary depths for a titanium metal layer 217 range from 250 to 500 Å, for example. Exemplary depths for a cobalt metal layer 217 range from about 160 to 330 Å, for example.

Figure 2D:
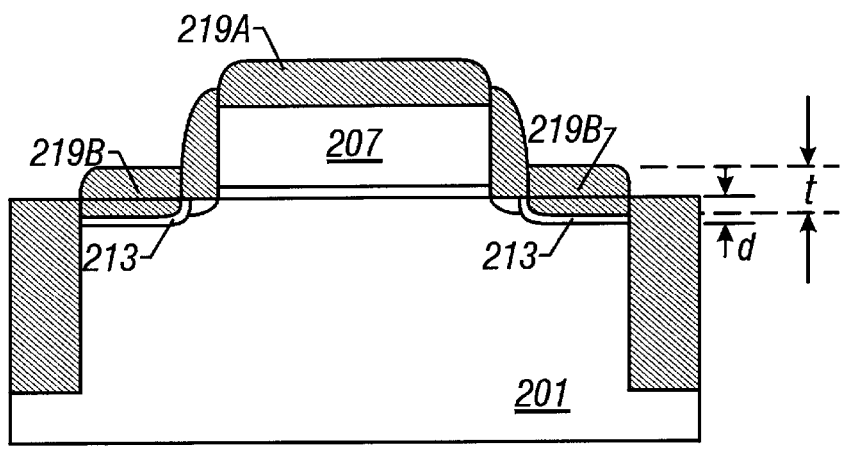

The metal layer 217 and silicon 215 are used to form a silicidation layer 219B over the source/drain regions 213. A silicidation layer 219A is also formed over the gate electrode 207 when a poly gate is used. The resultant structure is illustrated in FIG. 2D. It should be appreciated that the type of silicidation layer depends on the type of metal used. For example, when using a titanium metal layer, a $TiS_2$ silicidation layer if formed. The silicidation layers 219A and 219B are generally formed by heating the semiconductor wafer, thereby causing a silicide reaction to occur wherever the metal layer 217 is in contact with silicon. In areas where the metal layer 217 is not in contact with silicon, the metal layer 217 generally remains unreacted. Unreacted portions of the metal layer 217 are then removed using, for example, well-known etching techniques, to form the structure of FIG. 2D. In one particular embodiment, the silicidation layers 219A and 219B are formed using a two-step anneal process. When using a titanium metal layer 217, the two-step anneal process may, for example, include annealing the semiconductor wafer at a temperature ranging from 660 to 750° C. to cause a silicide reaction, removing unreacted portions of the metal layer 217, and performing a second anneal at a temperature ranging from 800 to 950° C.

The silicide reaction used to form the silicidation layers 219A and 219B typically consumes the silicon layer 215 and may also consume a portion of the silicon substrate in which the source/drain regions 213 are formed. The rate of silicon consumption can vary with the type of metal being used. The length of time that the semiconductor wafer is heated is selected in consideration of the desired thickness t of the silicidation layers 219B and in consideration of the type of metal being used. Suitable thicknesses t of the silicidation layers 219B range from about 200 to 600 Å, for example. It should be appreciated that a substantial portion (and if desired, all) of the silicidation layers 219B lies above the substrate surface rather than occupying portions of the source/drain regions 213. This, for example, allows for the formation of shallow source/drain junctions with relatively thick silicidation layers as compared to those formed using conventional processes. In particular, this process allows for the formation of semiconductor devices in which the ratio of silicidation layer 219B thickness t to the source/drain region 213 depth d can be 0.75:1 or greater. In other embodiments, the silicide thickness to source/drain junction depth ratio t:d can be greater than or equal to 1:1, 1.5:1, or 2:1. Of course, thickness to depth (t:d) ratios greater than 2:1 or less than 0.75:1 may be formed if desired.

Figure 2E:
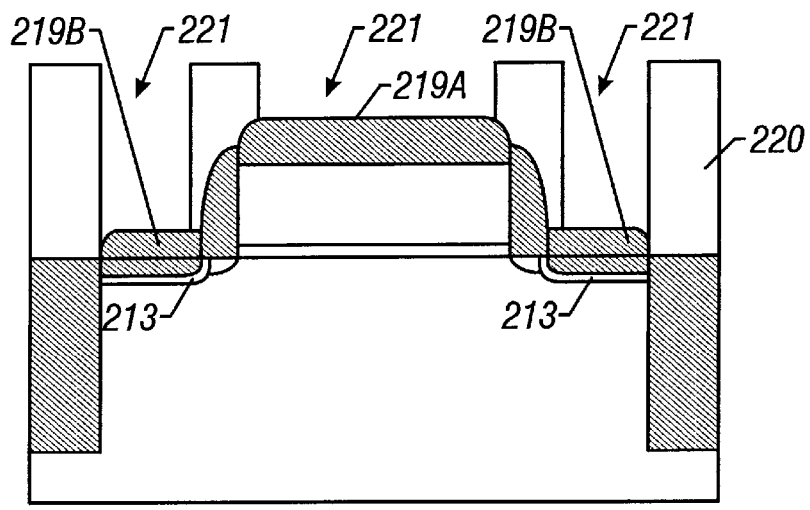

Processing continues with well-known fabrication techniques, such as, the formation of contacts and interconnects. An exemplary contact formation process will be illustrated with respect to FIG. 2E. In this exemplary process, a dielectric layer 220, typically an oxide, is formed over the substrate 201 using, for example, well-known deposition techniques. The dielectric layer 220 is then patterned and etched to form openings 221 exposing the silicidation layers 219A and 219B. The resultant structure is illustrated in FIG. 2E. The contact openings 221 are then typically filled with a metal to form contacts to the source/drain regions 213 and gate electrode 207.

Using the above process, elevated silicidation layers can be formed over source/drain regions of a semiconductor device. This, for example, allows for the formation of shallower source/drain regions while maintaining the thickness and sheet resistivity of the silicidation layer as compared to conventionally-formed source/drain regions and silicidation regions. In particular, using the above-process, silicidation layers having thicknesses of, for example, 0.75 to 2 times the depth of a source/drain region can be formed. For example, using the above-process, source/drain regions as thin as 300 Å may be formed with silicidation layers of 600 Å, if desired. This allows for further reduction in the scale of semiconductor devices and improved device performance.

As noted above, the present invention is applicable to the fabrication of a number of different devices having an elevated silicidation layer. For example, the above process can be used to form a number of different semiconductor devices, including but not limited to MOS structures such as p-type MOS devices (PMOS), n-type MOS devices (NMOS), and complimentary MOS (CMOS) semiconductor devices having both PMOS and NMOS devices. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices.

We claim:

1. A process of fabricating a semiconductor device, the process comprising:
   forming at least one gate electrode over a substrate;
   forming silicon over at least one active region of the substrate adjacent the gate electrode;
   forming a layer of metal over the silicon; and
   forming a silicidation layer over the active region using the metal layer and the silicon;
   forming a heavily-doped source/drain region in the active region;
   wherein the heavily-doped source/drain region has a depth and the silicidation layer has a thickness, the ratio of the silicidation layer thickness to the heavily-doped source/drain region depth being at least about 1.5:1.

2. The process of claim 1, wherein the ratio of the silicidation layer thickness to the heavily-doped source/drain region depth is at least about 2:1.

3. A process of fabricating a semiconductor device, the process comprising:
   forming at least one gate electrode over a substrate;
   forming silicon over at least one active region of the substrate adjacent the gate electrode;
   forming a layer of metal over the silicon; and
   forming a silicidation layer over the active region using the metal layer and the silicon;
   forming a source/drain region in the active region;
   wherein the source/drain region has a depth and the silicidation layer has a thickness, the ratio of the silicidation layer thickness to the source/drain region depth being at least about 0.75:1;
   wherein the source/drain region is an LDD source/drain region having a shallower region closer to the gate electrode and a deeper region further from the gate electrode, the deeper region defining the depth of the source/drain region.

4. A process of fabricating a semiconductor device, comprising;
   forming at least one gate electrode over a surface of a silicon substrate;
   depositing a silicon layer over an active region of the substrate adjacent the gate electrode;
   forming a metal layer of over the silicon layer; and
   forming a silicidation layer over the active region by reacting the metal layer with the silicon layer and the silicon substrate thereby consuming a portion of the silicon substrate.

5. The process of claim 4, further including forming a source/drain region in the active region, the source/drain region defining a maximum junction depth relative to the substrate surface.

6. The process of claim 5, wherein forming the silicidation layer includes forming the silicidation layer with an upper surface above the substrate surface and a lower surface below the substrate surface, the upper and lower silicidation layer surfaces defining a thickness therebetween.

7. The process of claim 6, wherein forming the silicidation layer includes forming the silicidation layer such that a ratio of the silicidation layer to the maximum source/drain region junction depth is 0.75 or more.

8. The process of claim 6, wherein forming the silicidation layer includes forming the silicidation layer such that a ratio of the silicidation layer to the maximum source/drain region junction depth is 1 or more.

9. The process of claim 6, wherein forming the silicidation layer includes forming the silicidation layer such that a ratio of the silicidation layer to the maximum source/drain region junction depth is 1.5 or more.

10. The process of claim 6, wherein forming the silicidation layer includes forming the silicidation layer such that a ratio of the silicidation layer to the maximum source/drain region junction depth is 2 or more.

11. The process of claim 6, wherein forming the silicidation layer includes forming the silicidation layer such that a ratio of the silicidation layer to the maximum source/drain region junction depth ranges from 0.75 to 2.

12. The process of claim 11, wherein forming the source/drain region includes forming a shallow region closer to the gate electrode and a deeper region further from the gate electrode, the maximum junction depth being defined by the deeper region of the source/drain region.

13. The process of claim 5, further including forming spacers, of similar height as the gate electrode, adjacent the gate electrode, wherein forming the silicon layer over the active region includes forming the silicon layer over the spacers and the gate electrode without removing a portion of the gate electrode.

14. The process of claim 13, wherein forming the metal layer includes forming the metal layer over the silicon layer on the gate electrode and forming the silicidation layer includes forming a silicidation layer over the gate electrode.

15. A process of fabricating a semiconductor device, the process comprising:

forming a gate electrode over a surface of a substrate;

forming, in the substrate adjacent the gate electrode, a source/drain region having a maximum junction depth of about 1000 angstroms or less;

forming a silicon layer the source/drain region;

forming a metal layer over the silicon layer; and forming, over the source/drain region, a silicidation layer having a thickness greater than the depth of the source/drain region, the silicidation layer being formed at least in part using the metal layer and the silicon layer, wherein forming the silicidation layer includes consuming a portion of the silicon substrate.

16. A process of fabricating a semiconductor device, the process comprising:

forming a gate electrode over a surface of a substrate;

forming, in the substrate adjacent the gate electrode, a heavily-doped source/drain region having a maximum junction depth of about 1000 angstroms or less;

forming a silicon layer over the heavily-doped source/drain region;

forming a metal layer over the silicon layer; and forming, over the heavily-doped source/drain region, a silicidation layer having a thickness greater than the maximum junction depth of the heavily-doped source/drain region, the silicidation layer being formed at least in part using the metal layer and the silicon layer.

17. The process of claim 16, wherein forming the silicidation layer includes forming the silicidation layer with a thickness about 1–2 times the maximum junction depth of the heavily-doped source/drain region.

18. The process of claim 16, wherein forming the silicidation layer includes forming the silicidation layer with a thickness about 2 times the maximum junction depth of the heavily-doped source/drain region.

19. A process of fabricating a semiconductor device, the process comprising:

forming a gate electrode over a surface of a substrate;

forming, in the substrate adjacent the sate electrode, a source/drain region having a maximum junction depth of about 1000 angstroms or less;

forming a silicon layer the source/drain region;

forming a metal layer over the silicon layer; and forming, over the source/drain region, a silicidation layer having a thickness greater than the depth of the source/drain region, the silicidation layer being formed at least in part using the metal layer and the silicon layer, wherein forming the silicidation layer includes forming the silicidation layer with a thickness about 2 times the maximum junction depth of the source/drain region, wherein forming the silicidation layer includes forming the silicidation layer with a thickness ranging from about 200 to about 600 angstroms.

20. A process of fabricating a semiconductor device, the process comprising:

forming a gate electrode over a surface of a substrate;

forming, in the substrate adjacent the gate electrode, a source/drain region having a maximum junction depth of about 1000 angstroms or less;

forming a silicon layer the source/drain region;

forming a metal layer over the silicon layer; and forming, over the source/drain region, a silicidation layer having a thickness greater than the depth of the source/drain region, the silicidation layer being formed at least in part using the metal layer and the silicon layer, wherein forming the silicidation layer includes forming the silicidation layer with a thickness ranging from about 200 to about 600 angstroms.

21. The process of claim 20, wherein forming the silicon layer includes forming the silicon layer with a thickness ranging from about 250 to about 500 angstroms.

22. The process of claim 21, wherein forming the metal layer includes forming the metal layer with a thickness ranging from about 160 to about 500 angstroms.

23. The process of claim 22, wherein forming the metal layer includes forming a cobalt layer with a thickness ranging from about 160 to about 330 angstroms.

24. The process of claim 22, wherein forming the metal layer includes forming a cobalt layer with a thickness ranging from about 250 to about 500 angstroms.

* * * * *

UNITED STATES PATENT AND TRADEMARK OFFICE
CERTIFICATE OF CORRECTION

PATENT NO. : 6,037, 232
DATED : March 14, 2000
INVENTOR(S) : Wieczorek et al.

It is certified that error appears in the above-identified patent and that said Letters Patent is hereby corrected as shown below:

<u>Title page</u>,
Item [75] Inventors: should read -- Karsten Wieczorek --.

Signed and Sealed this

Thirty-first Day of July, 2001

Attest:

NICHOLAS P. GODICI
Attesting Officer
Acting Director of the United States Patent and Trademark Office